United States Patent
Lee et al.

(10) Patent No.: US 11,755,439 B2
(45) Date of Patent: Sep. 12, 2023

(54) MEMORY CONTROLLER, TEST DEVICE AND LINK IDENTIFICATION METHOD

(71) Applicant: Silicon Motion, Inc., Hsinchu County (TW)

(72) Inventors: Cheng-Yu Lee, Hsinchu County (TW); Te-Kai Wang, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 63 days.

(21) Appl. No.: 17/700,514

(22) Filed: Mar. 22, 2022

(65) Prior Publication Data

US 2022/0405179 A1   Dec. 22, 2022

(30) Foreign Application Priority Data

Jun. 22, 2021   (TW) ................. 110122761

(51) Int. Cl.
*G06F 11/22* (2006.01)
*G06F 11/273* (2006.01)
*G06F 11/263* (2006.01)

(52) U.S. Cl.
CPC ...... *G06F 11/2273* (2013.01); *G06F 11/2284* (2013.01); *G06F 11/263* (2013.01); *G06F 11/2635* (2013.01); *G06F 11/2733* (2013.01)

(58) Field of Classification Search
CPC ............. G06F 11/2273; G06F 11/2284; G06F 11/263; G06F 11/2635; G06F 11/2733; G06F 11/2221; G06F 11/1048; G06F 13/1673; G06F 11/2236; G11C 29/022

USPC ......................... 714/724, 752, 776
See application file for complete search history.

(56) References Cited

U.S. PATENT DOCUMENTS

| | | | |
|---|---|---|---|
| 9,760,502 B2 | 9/2017 | Raam | |
| 10,720,224 B2* | 7/2020 | Caraher | G06F 11/263 |
| 2014/0016551 A1* | 1/2014 | Shin | H04W 76/11 370/328 |
| 2016/0034413 A1* | 2/2016 | Park | G06F 13/4265 710/105 |

(Continued)

FOREIGN PATENT DOCUMENTS

| | | |
|---|---|---|
| CN | 101689246 B | 5/2012 |
| TW | I516931 B | 1/2016 |
| TW | I525631 B | 3/2016 |

*Primary Examiner* — Shelly A Chase
*Assistant Examiner* — Osman M Alshack
(74) *Attorney, Agent, or Firm* — Winston Hsu

(57) ABSTRACT

A memory controller coupled to a memory device and configured to control access operations of the memory device includes a host interface and a microprocessor. The microprocessor is coupled to the host interface and configured to set a value of a predetermined parameter to a specific value after the memory controller powers up and start to perform a link flow to try to establish a transmission link via the host interface. The predetermined parameter is one of a plurality of capability parameters of the host interface and the predetermined parameter is related to reception of the host interface. After the link flow is completed, the microprocessor is further configured to identify an object device with which the host interface establishes the transmission link according to the specific value and at least one of a plurality of attribute parameters associated with the transmission link.

13 Claims, 4 Drawing Sheets

(56) References Cited

U.S. PATENT DOCUMENTS

| | | | | |
|---|---|---|---|---|
| 2016/0156576 A1* | 6/2016 | Jeng | ............... | H04L 51/212 |
| | | | | 709/206 |
| 2017/0109315 A1* | 4/2017 | Safranek | ............. | G06F 13/4022 |
| 2019/0108124 A1* | 4/2019 | Das Sharma | ....... | G06F 12/0808 |
| 2021/0382639 A1* | 12/2021 | Liang | ................... | G06F 3/0632 |
| 2022/0147274 A1* | 5/2022 | Kim | ................. | G11C 11/40618 |

* cited by examiner

MEMORY CONTROLLER, TEST DEVICE AND LINK IDENTIFICATION METHOD

BACKGROUND OF THE INVENTION

1. Field of the Invention

The invention relates to a link identification method suitable for a product testing process and a memory controller implementing the link identification method.

2. Description of the Prior Art

With the rapid growth of data storage technology in recent years, many data storage devices—such as memory cards manufactured in compliance with the Secure Digital (SD)/Multi Media Card (MMC) standards, Compact Flash (CF) standards, Memory Stick (MS) standards or Extreme Digital (XD) standards, as well as solid state drives, Embedded Multi Media Cards (eMMC) and Universal Flash Storage (UFS)—have been used widely for a variety of purposes. Therefore, the demand for data storage devices in various fields has also grown significantly.

Suppliers of data storage devices usually provide product testing services to their clients. For example, after the client package the chip of the data storage device according to his requirements, the packaged chip is provided to the supplier for undergoing product test. In the product testing process, the chip under test may have to be connected to different devices at different test phases/test stations, or the transmission interface of the chip under test may have different ways of connection according to the test items. In addition, the transmission interface of the chip under test may also need to be connected with the corresponding interface during the testing process based on test requirements. In order to correctly identify the object that is connected to the transmission interface of the chip under tested during the testing process and to avoid the failure of the testing process due to errors of connection identification, an effective link identification method is required.

SUMMARY OF THE INVENTION

It is an objective of the invention to correctly identify the object with which a transmission interface of the device under test establishes a transmission link during the testing process, to avoid the aforementioned problem that the testing process cannot be completed due to link identification errors.

According to an embodiment of the invention, a memory controller coupled to a memory device and configured to control access operations of the memory device comprises a host interface and a microprocessor. The microprocessor is coupled to the host interface and configured to set a value of a predetermined parameter to a specific value after the memory controller powers up and start to perform a link flow to try to establish a transmission link via the host interface. The predetermined parameter is one of a plurality of capability parameters of the host interface and the predetermined parameter is related to reception of the host interface. After the link flow is completed, the microprocessor is further configured to identify an object device with which the host interface establishes the transmission link according to the specific value and at least one of a plurality of attribute parameters associated with the transmission link.

According to another embodiment of the invention, a test device comprising said memory controller installed in the test device, and the test device further comprises a transmission pin, a reception pin and a trace. The transmission pin is coupled to a transmission terminal of the host interface. The reception pin is coupled to a reception terminal of the host interface. The trace is connecting the transmission pin and the reception pin.

According to yet another embodiment of the invention, a link identification method for a memory controller coupled to a memory device and configured to control access operations of the memory device comprises: setting a value of a predetermined parameter of the memory controller to a specific value after the memory controller powers up, wherein the predetermined parameter is one of a plurality of capability parameters of the memory controller and the predetermined parameter is related to reception of a host interface of the memory controller; performing a link flow to try to establish a transmission link via the host interface; and identifying an object device with which the host interface establishes the transmission link according to the specific value and at least one of a plurality of attribute parameters associated with the transmission link after the link flow is completed.

These and other objectives of the present invention will no doubt become obvious to those of ordinary skill in the art after reading the following detailed description of the preferred embodiment that is illustrated in the various figures and drawings.

DETAILED DESCRIPTION

In the following, numerous specific details are described to provide a thorough understanding of embodiments of the invention. However, one of skilled in the art will understand how to implement the invention in the absence of one or more specific details, or relying on other methods, elements or materials. In other instances, well-known structures, materials or operations are not shown or described in detail in order to avoid obscuring the main concepts of the invention.

Reference throughout this specification to "one embodiment", "an embodiment", "one example" or "an example" means that a particular feature, structure or characteristic described in connection with the embodiment or example is included in at least one embodiment of a plurality of embodiments. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples.

In addition, in order to make the objects, features and advantages of the invention more comprehensible, specific embodiments of the invention are set forth in the accompanying drawings. This description is made for the purpose of illustrating the general principles of the invention and should not be taken in a limiting sense. It should be understood that the following embodiments can be implemented by software, hardware, firmware, or any combination thereof.

Figure 1:
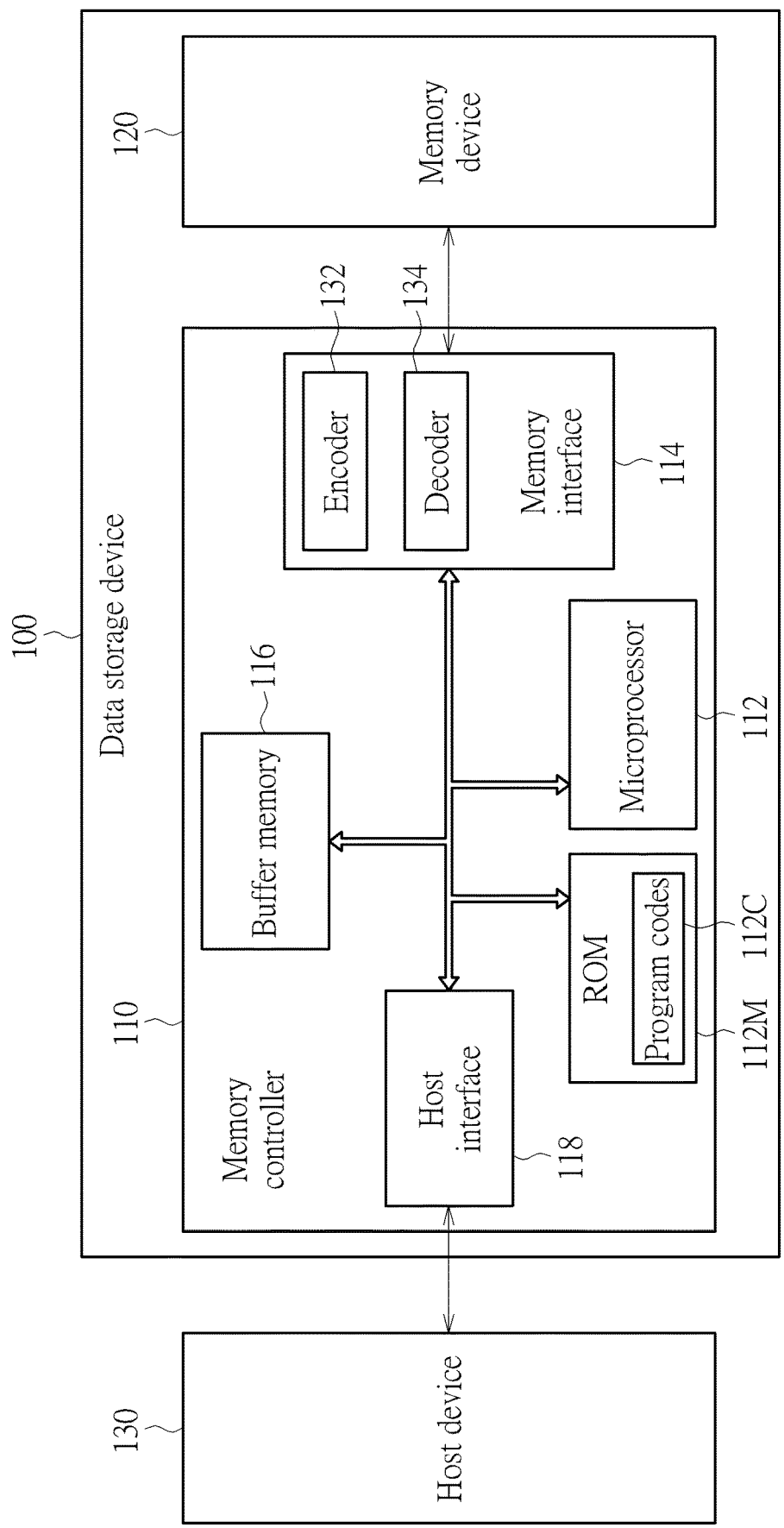
FIG. 1 shows an exemplary block diagram of a data storage device according to an embodiment of the invention.

FIG. 1 shows an exemplary block diagram of a data storage device according to an embodiment of the invention. The data storage device 100 may comprise a memory device 120 and a memory controller 110. The memory controller 110 is configured to access the memory device 120 and control operations of the memory device 120. The memory device 120 may be a non-volatile (NV) memory (e.g. a Flash memory) device and may comprise one or more memory elements (e.g. one or more Flash memory dies, or one or more Flash memory chip, or the likes).

According to an embodiment of the invention, the memory controller 110 may comprise a microprocessor 112, a Read Only Memory (ROM) 112M, a memory interface 114, a buffer memory 116 and a host interface 118. The ROM 112M is configured to store program codes 112C. The microprocessor 112 is configured to execute the program codes 112C, thereby controlling access to the memory device 120. The program codes 112C may comprise one or more program modules, such as the boot loader code. When the data storage device 100 obtains power from the host device 130, the microprocessor 112 may perform an initialization procedure of the data storage device 100 by executing the program codes 112C. In the initialization procedure, the microprocessor 112 may load a group of In-System Programming (ISP) codes (not shown in FIG. 1) from the memory device 120. The microprocessor 112 may execute the group of ISP codes, so that the data storage device 100 has various functions. According to an embodiment of the invention, the group of ISP codes may comprise, but are not limited to: one or more program modules related to memory access (e.g. read, write and erase), such as a read operation module, a table lookup module, a wear leveling module, a read refresh module, a read reclaim module, a garbage collection module, a sudden power off recovery (SPOR) module and an uncorrectable error correction code (UECC) module, respectively provided for performing the operations of read, table lookup, wear leveling, read refresh, read reclaim, garbage collection, SPOR and error handling for detected UECC error. The memory interface 114 may comprise an encoder 132 and a decoder 134. The encoder 132 is configured to encode the data to be written into the memory device 120 to generate the corresponding correction code (or, may be named as an Error Correction Code (ECC)). The decoder 134 is configured decode the data read out from the memory device 120.

The memory controller 110 may perform various control operations by using its own internal components. For example, the memory controller 110 may use the memory interface 114 to control the access operations (especially the access operation for at least a memory block or at least a page) of the memory device 120, use the buffer memory 116 to perform necessary data buffer operations, and use the host interface 118 to communicate with a host device 130.

The host device 130 may issue commands, such as the read command or the write command, to the data storage device 100, so as to access the data stored in the memory device 120, or the host device 130 may issue commands to further control or manage the data storage device 100.

In an embodiment, the buffer memory 116 may be implemented by a Random Access Memory (RAM). For example, the buffer memory 116 may be a Static RAM (SRAM), but the invention should not be limited thereto. In other embodiments, the buffer memory 116 may be a Dynamic RAM (DRAM).

In an embodiment, the host interface 118 may be a hardware interface with corresponding firmware/software designs and configured to transmit communication signals and the read/write data between the memory controller 110 and the host device 130, and control the scheduling of the read/write tasks. For example, the memory controller 110/microprocessor 112 may have the host interface 118 to perform the aforementioned operations by executing the program codes of the corresponding firmware/software.

In an embodiment of the invention, the memory controller 110 may use the host interface 118 to communicate with the host device 130 in compliance with a standard communication protocol. For example, the standard communication protocol may comprise (but is not limited to) the Universal Serial Bus (USB) standard, the SD interface standard, the Ultra High Speed-I (UHS-I) interface standard, the Ultra High Speed-II (UHS-II) interface standard, the CF interface standard, the MMC interface standard, the eMMC interface standard, the UFS interface standard, the Advanced Technology Attachment (ATA) standard, the Serial ATA (SATA) standard, the Peripheral Component Interconnect Express (PCI-E) standard, the Parallel Advanced Technology Attachment (PATA) standard, etc.

As discussed above, suppliers or manufacturers of the memory controller 110 or the data storage device 100 may test the packaged chips or devices. During the testing process, the chips or devices under test may have to be connected to different devices at different test phases/test stations, or the transmission interface of the chips or devices under test may have different ways of connection according to the test items. In addition, the transmission interface of the chips or devices under test may also have to establish a connection with a corresponding interface of a peer device due to test requirements during the testing process.

For example, a predetermined testing process may involve two test phases/test stations. In the first test phase, the chip or device under test (as an example, may be a chip comprising the memory controller 110 or the data storage device 100) (hereinafter will be collectively named as "device under test" for brevity) may be connected with a host device (such as the host device 130 shown in FIG. 1) and the host device may load the software/firmware programs required in the testing process into the device under test and set the values for the corresponding parameters or registers required in the testing process. In the first test phase, whether the communication between the host interface 118 and the host device 130 goes normally can be test through the above-mentioned operations. In the second test phase, the device under test is not connected to any host device, but is installed in a test device configured for testing. The test device may be a fixture or a specific jig. Therefore, in the second test phase, the test device should ignore any commands (if any) from the host device. In the second test phase, the test device may perform a loopback test and perform a self-test under the control of the memory controller 110 to test whether the communication between the memory controller 110 and the memory device 120 goes normally, for example, by testing whether the read, write, erase, and other operations of the memory device 120 function normally.

It is to be noted that the host device connected to the device under test in the first test phase and the host device connected to the device under test when it finally becomes a product are usually different. In the testing process, the host device 130 connected to the data storage device 100 may be a chip specially designed for performing the product test. When the data storage device 100 finally becomes a product, for example, in some embodiments, the data storage device 100 may be a portable storage device (for example, the memory card in compliance with the SD/MMC, CF, MS and/or XD standard), and the host device 130 may be an electronic device, such as a mobile phone, a notebook computer, a desktop computer . . . etc., capable of connecting to the data storage device. For another example, in another embodiment of the invention, when the data storage device 100 finally becomes a product, the data storage device 100 may be a solid state hard disk or an embedded storage device in compliance with the UFS or the eMMC standards, and may be equipped in an electronic device such as a mobile phone, a notebook computer, or a desktop computer. In such an embodiment, the host device 130 may be a processor of the electronic device.

Figure 2:
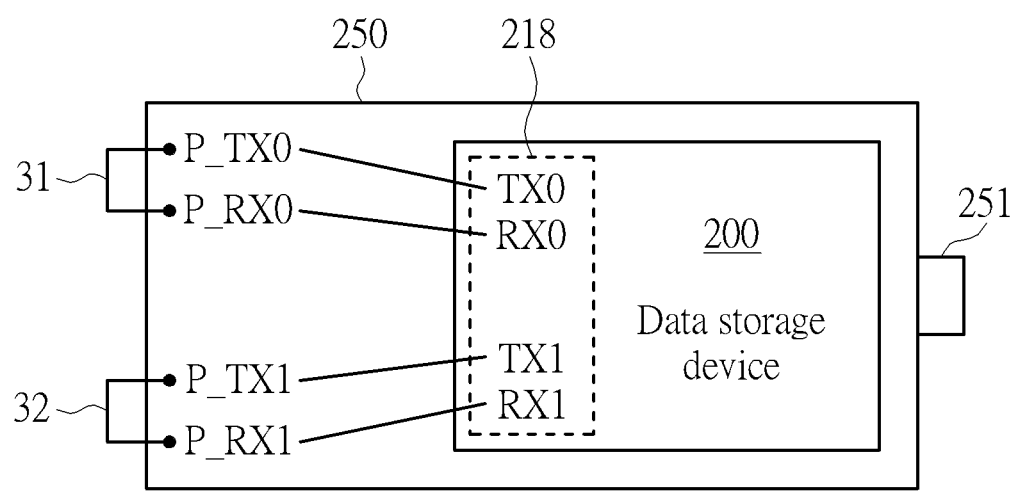
FIG. 2 is a schematic diagram showing a test device equipped with a device under test according to an embodiment of the invention.

FIG. 2 is a schematic diagram showing a test device equipped with a device under test according to an embodiment of the invention. In this embodiment, the device under test may be a data storage device 200 and the data storage device 200 may be the data storage device 100 shown in FIG. 1. The test device 250 may comprise a slot (not shown in FIG. 2) and the data storage device 200 may be installed in the test device 250 by being inserted into the slot. In addition, the test device 250 may comprise one or more transmission pins, such as the transmission pins P_TX0 and P_TX1, one or more reception pins, such as the reception pins P_RX0 and P_RX1 and a connector 251. The test device 250 may obtain power through the connector 251. For example, the connector 251 may be a USB plug, and the test device 250 may obtain power by inserting the connector 251 into an USB socket that is able to supply power. In this embodiment, the host interface 218 of the data storage device 200 may be a two-lane design, that is, the host interface 218 may comprise two transmission terminals TX0 and TX1 and two reception terminals RX0 and RX1. The transmission pins P_TX0 and P_TX1 are respectively configured to connect the transmission terminals TX0 and TX1 of the host interface 218 and the reception pins P_RX0 and P_RX1 are respectively configured to connect the reception terminals RX0 and RX1 of the host interface 218. It is to be noted that the symbol 218 in FIG. 2 is used to indicate that the transmission terminals TX0 and TX1 and the reception terminals RX0 and RX1 are comprised in the host interface 218, and the components comprised in the host interface 218 should not be limited to what are shown in FIG. 2. Those skilled in the art will readily appreciate that a host interface may further comprise other components not shown in the figure to implement corresponding operations.

In the embodiments of the invention, in order to enable the data storage device 200 to perform a loopback test, the test device 250 may have a loopback layout. As shown in FIG. 2, the test device 250 may be routed with traces 31 and 32. The trace 31 is configured to connect the transmission pin P_TX0 and the reception pin P_RX0 and the trace 32 is configured to connect the transmission pin P_TX1 and the reception pin P_RX1. When the data storage device 200 is installed in the test device 250, the transmission pin P_TX0 is coupled or connected to the transmission terminal TX0 and the reception pin P_RX0 is coupled or connected to the reception terminal RX0, thereby the transmission terminal TX0 is coupled or connected to the reception terminal RX0 via the trace 31. Similarly, when the data storage device 200 is installed in the test device 250, the transmission pin P_TX1 is coupled or connected to the transmission terminal TX1 and the reception pin P_RX1 is coupled or connected to the reception terminal RX1, thereby the transmission terminal TX1 is coupled or connected to the reception terminal RX1 via the trace 32. In the second test phase, the data storage device 200 may utilize the loopback layout to perform the loopback test, so as to test whether the transmission and reception on the two lanes of the host interface function normally.

Generally, when the data storage device 100/200 obtains power (that is, provided with power or powers on), a link flow is performed, so as to try to establish a transmission link with a corresponding interface of a peer device via the host interface. For example, when the data storage device 100/200 is implemented as a data storage device conforming to the UFS standards, because the UFS adopts the physical layer M-PHY developed by the Mobile Industry Processor Interface (MIPI) alliance, the data storage device 100/200 has to perform a Link Flow in compliance with the Unified Protocol (UniPro) developed by the MIPI alliance after powers on.

However, since the device under test (e.g. the data storage device) is connected to a host device in the first test phase and then connected to its own transmission interface via the loopback layout of the test device 250 in the second test phase, it is possible for the device under test to successfully establish a transmission link during the link flow in both the first test phase and the second test phase. Therefore, it would be insufficient to identify which device the device under test is currently establishing a transmission link with only based on whether the transmission link has been successfully established. If the device under test is unable to make correct identification in the testing process, there will a problem that the testing process cannot be completed due to a link identification error.

In order to correctly identify with which object the transmission interface (for example, the host interface 118/218) of the device under test is establishing a transmission link during the testing process, so as to avoid the aforementioned problem that the testing process cannot be completed due to link identification errors, an effective link identification method is required.

Figure 3:
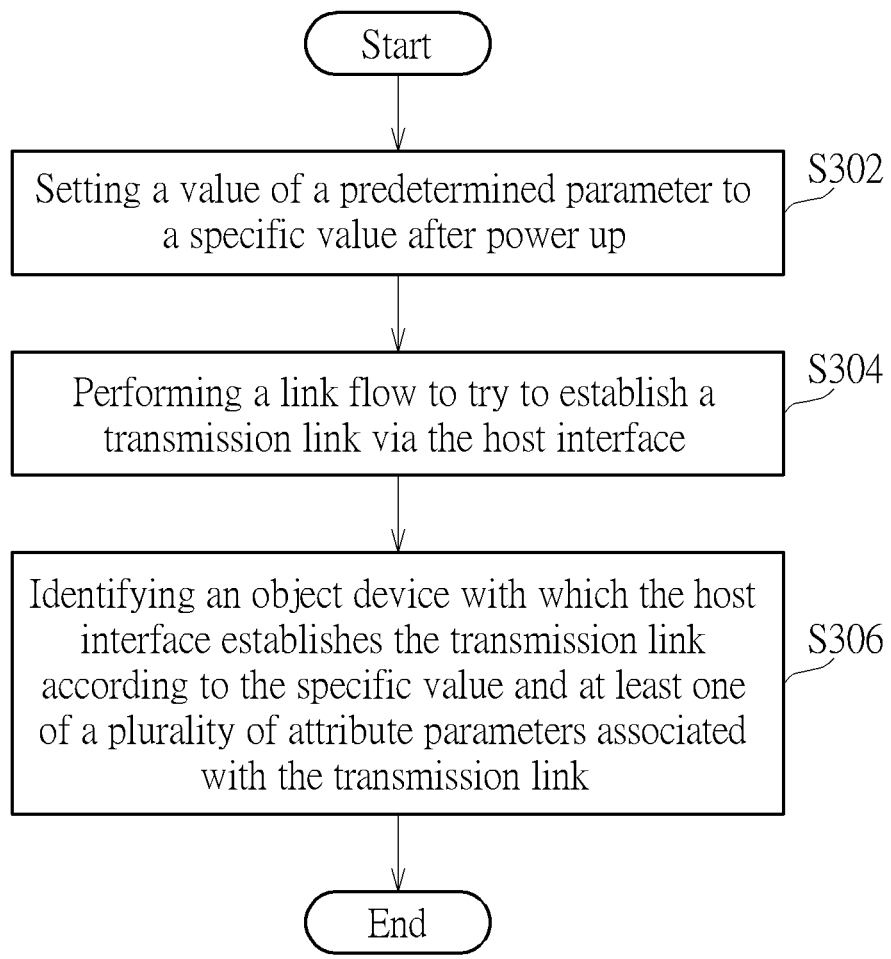
FIG. 3 is an exemplary flow chart of a link identification method according to an embodiment of the invention.

FIG. 3 is an exemplary flow chart of a link identification method according to an embodiment of the invention. The link identification method comprises the following steps:

Step S302: Setting a value of a predetermined parameter to a specific value after the data storage device 100/200 and/or the memory controller 110 powers up. According to an embodiment of the invention, the predetermined parameter is one of a plurality of capability parameters of the memory controller 110, as an example, the predetermined parameter may be a capability parameter related to reception of the host interface 118/218. In addition, according to an embodiment of the invention, the parameter chosen in this step for setting the specific value is a capability parameter that will be exchanged when performing the link flow. For example, a transmitter and a receiver of a transmission link will provide their capability parameters to the other party as a reference for subsequent parameter setting during the communication or in a handshake process.

Step S304: Performing a link flow to try to establish a transmission link via the host interface. It is to be noted that in the embodiments of the invention, performance of step S302 must be earlier than performance of step S304. That is, setting the value of the predetermined parameter to the specific value must be done before starting the link flow. In addition, according to an embodiment of the invention, the data storage device 100/200 may perform the link flow in compliance with the aforementioned Unified Protocol (UniPro).

Step S306: Identifying an object device with which the host interface establishes the transmission link according to the specific value and at least one of a plurality of attribute parameters associated with the transmission link after the link flow is completed. As described above, in the link flow, the transmitter and the receiver of this transmission link respectively provide their capability parameters to the other party, and the transmitter and the receiver respectively set the corresponding value of a plurality of attribute parameters associated with the transmission link according to the settings of their own capability parameters and the settings of the other party's capability parameters. After the attribute parameter setting is completed, the final setting value of an attribute parameter associated with the aforementioned predetermined parameter among the plurality of attribute parameters may be utilized to determine whether the object device with which the data storage device 100/200 establishes the transmission link is another peer host device or is the data storage device 100/200 itself.

According to an embodiment of the invention, the link identification method may further comprise the following step: when the object device with which the host interface establishes the transmission link is identified, determining a subsequent operation based on an identification result of the object device.

To be more specific, according to an embodiment of the invention, after the memory controller 110 powers up, the microprocessor 112 may set a value of the aforementioned predetermined parameter to the specific value, as an example, set to a maximum allowable value, and may start to perform a link flow to try to establish a transmission link via the host interface. According to an embodiment of the invention, the aforementioned predetermined parameter may be a capability parameter related to an operation time required by the host interface 118/218. For example, the aforementioned predetermined parameter may be the capability parameter RX_Hibern8Time_Capability of the receiver, which specifies the shortest time the receiver must stay in the hibernate mode after entering the hibernate mode. For another example, the aforementioned predetermined parameter may be the capability parameter RX_Min_ActivateTime_Capability of the receiver, which specifies the time required for the receiver to start the first action after the receiver wakes up. According to another embodiment of the invention, the aforementioned predetermined parameter may be parameter related to a synchronization pattern utilized by the host interface 118/218. For example, the aforementioned predetermined parameter may be the parameter RX_HS_G1_SYNC_LENGTH of the receiver (where the term G1 represents the first gear Gear 1 of the high speed (HS) mode, and may be changed to other gears defined by MIPI), and this parameter specifies the length of the synchronization pattern utilized by the receiver.

It is to be noted that the parameters introduced above are just a few examples for implementing the invention, and the invention is not limited to only the aforementioned parameters. As described above, in the embodiments of the invention, the microprocessor may select one or more parameters from the plurality of capacity parameters related to the receiver of the host interface 118/218 or from the plurality of parameters related to reception of the memory controller 110 and/or the host interface 118/218 for setting the value thereof to the specific value. In addition, the parameter selected for the setting of the specific value is the parameter that will be exchanged between the transmitter and the receiver when performing the subsequent link flow.

After the setting of the specific value to the parameter is completed, the microprocessor 112 may start a link flow. Table 1 illustrates the link flow specified in the UniPro standards, where the abbreviation PA refers to the PHY adapter layer.

TABLE 1

| Link Flow example | | |
|---|---|---|
| Phase | PA Transmitter | PA Receiver |
| 0 | Send TRG_UPR0 (all Lanes). | Wait for TRG_UPR0 reception. Lane discovery. |
| 0b | Send two additional TRG_UPR0 (all Lanes). | Ignore all data. |
| 1 | Send TRG_UPR1. | Wait for TRG_UPR1 reception on all Lanes. Re-align Lane numbering. |
| 2 | Send two additional TRG_UPR1. Then proceed with phase 3. | Ignore all data. |
| 3 | Send TRG_UPR2 on all Lanes. | Wait for TRG_UPR2 reception on PHY RX Data Lane 0. |
| 4 | Send two additional TRG_UPR2 on all Lanes. Then proceed with Phase 5. | Ignore all data. |
| 5 | Transfer Capabilities, Initiate Capability transfer of potential Media Converter. Receive Capabilities and apply down grading. | Receive Capabilities and apply down grading. |

For more detailed description of the linking flow, reference may be made to Specification for Unified Protocol (UniProSM) Version 1.61-16 Oct. 2015, Chapter 5.6.3 Link Startup Sequence.

In the fifth phase of the link flow, the transmitter end and receiver exchange their capability parameters and apply the obtained capability parameters in a down grading manner. For example, the method of setting the attribute parameter PA_Hibern8Time specified in the UniPro standards is:

$$PA\_Hibern8Time=\max(TX\_Hibern8Time\_Capability, peer\_RX\_Hibern8Time\_Capability) \quad \text{Eq. (1)}$$

The parameter PA_Hibern8Time specifies the shortest time to stay in the Hibernate mode after entering the Hibernate mode, where max(A,B) is an operation that takes the maximum value between A and B, the parameter TX_Hibern8Time_Capability specifies the shortest time for the transmitter to stay in the Hibernate mode after entering the Hibernate mode, and the parameter peer_RX_Hibern8Time_Capability (which is obtained by the transmitter through parameter exchange) specifies the shortest time for the peer receiver to stay in the Hibernate mode after entering the Hibernate mode. Generally, because the shorter the time it is required for a device to return from the Hibernate mode to a normal mode, the faster the response speed of the device is, for the device having faster speed, setting the value of this parameter by taking the maximum value is equivalent to apply the obtained capability parameter in a down grading manner.

For another example, the method of setting the attribute parameter PA_TActivate specified in the UniPro standards is:

$$PA\_TActivate=peer\_RX\_Min\_ActivateTime\_Capability \quad \text{Eq. (2)}$$

The parameter PA_TActivate specifies the time required to start the first action after waking up, the parameter peer_RX_Hibern8Time_Capability (which is obtained by the transmitter through parameter exchange) specifies the time required for a peer receiver to start the first action after waking up.

For yet another example, the method of setting the attribute parameter PA_TxHsG1SyncLength specified in the UniPro standards is:

$$PA\_TxHsG1SyncLength = peer\_RX\_HS\_G1\_SYNC\_LENGTH \quad \text{Eq. (3)}$$

The parameter specifies the length of the synchronization pattern utilized under the first gear in HS mode, the parameter peer_RX_HS_G1_SYNC_LENGTH (which is obtained by the transmitter through parameter exchange) specifies the length of the synchronization pattern utilized by a peer receiver under the first gear in HS mode.

In the embodiments of the invention, before the link flow is started, the microprocessor 112 may set a value of at least one of the chosen predetermine parameters (for example, but not limited to the aforementioned RX_Hibern8Time_Capability, RX_Min_ActivateTime_Capability and/or RX_HS_G1_SYNC_LENGTH) to the specific value, as an example, set the value thereof to a very large value (for example, 0x7D in hexadecimal).

During the time when performing the link flow, the transmitter may obtain the capability parameters of the receiver by parameter exchange, and may set the corresponding value of a plurality of attribute parameters associated with the transmission link according to the capability parameters of the transmitter and/or the receiver. For example, suppose that the data storage device 100/200 is connected to the host device 130 in the first test phase, since the data storage device 100/200 and the host device 130 will perform parameter exchange in the link flow, the values that will be filled into the fields of the parameters peer_RX_Hibern8Time_Capability, peer_RX_Min_ActivateTime_Capability and peer_RX_HS_G1_SYNC_LENGTH are the values of the parameters RX_Hibern8Time_Capability, RX_Min_ActivateTime_Capability and RX_HS_G1_SYNC_LENGTH set by the host device 130.

On the contrary, suppose that it is now in the second test phase and the data storage device 100/200 is connected to the transmission interface itself via the loopback layout of the test device, the data storage device 100/200 performs parameter exchange with itself in the link flow, and thus the values that will be filled into the fields of the parameters peer_RX_Hibern8Time_Capability, peer_RX_Min_ActivateTime_Capability and peer_RX_HS_G1_SYNC_LENGTH are the values of the parameters RX_Hibern8Time_Capability, RX_Min_ActivateTime_Capability and RX_HS_G1_SYNC_LENGTH set by the data storage device 100/200.

In this manner, the microprocessor 112 may determine whether the object device with which the data storage device 100/200 establishes the transmission link is another peer host device or is the data storage device 100/200 itself based on the final setting value of the attribute parameter associated with the aforementioned predetermined parameter. To be more specific, when the microprocessor 112 chooses the capability parameter RX_Hibern8Time_Capability as the predetermined parameter for setting the specific value, when the microprocessor 112 determines that a value of the attribute parameter PA_Hibern8Time in Eq. (1) is set to this specific value after the link flow is completed, the microprocessor 112 determines that the object device with which the host interface 118/218 establishes the transmission link is the memory controller 110 itself. On the other hand, when the microprocessor 112 determines that a value of the attribute parameter PA_Hibern8Time in Eq. (1) is not set to this specific value after the link flow is completed, the microprocessor 112 determines that the object device with which the host interface 118/218 establishes the transmission link is not the memory controller 110 itself, but a host device.

Similarly, when the microprocessor 112 chooses the capability parameter RX_Min_ActivateTime_Capability and/or RX_HS_G1_SYNC_LENGTH as the predetermined parameter for setting the specific value, when the microprocessor 112 determines that a value of the attribute parameter in Eq. (2) and/or Eq. (3) is set to this specific value after the link flow is completed, the microprocessor 112 determines that the object device with which the host interface 118/218 establishes the transmission link is the memory controller 110 itself. When the microprocessor 112 determines that a value of the attribute parameter in Eq. (2) and/or Eq. (3) is not set to this specific value after the link flow is completed, the microprocessor 112 determines that the object device with which the host interface 118/218 establishes the transmission link is not the memory controller 110 itself, but a host device.

When the microprocessor 112 identifies the object device (that is, whether the object device that is currently establishing a transmission link with the host interface 118/218 is the memory controller 110 itself or a host device is determined), an identification result is obtained and the microprocessor 112 may further determine a subsequent operation based on the identification result of the object device.

Figure 4:
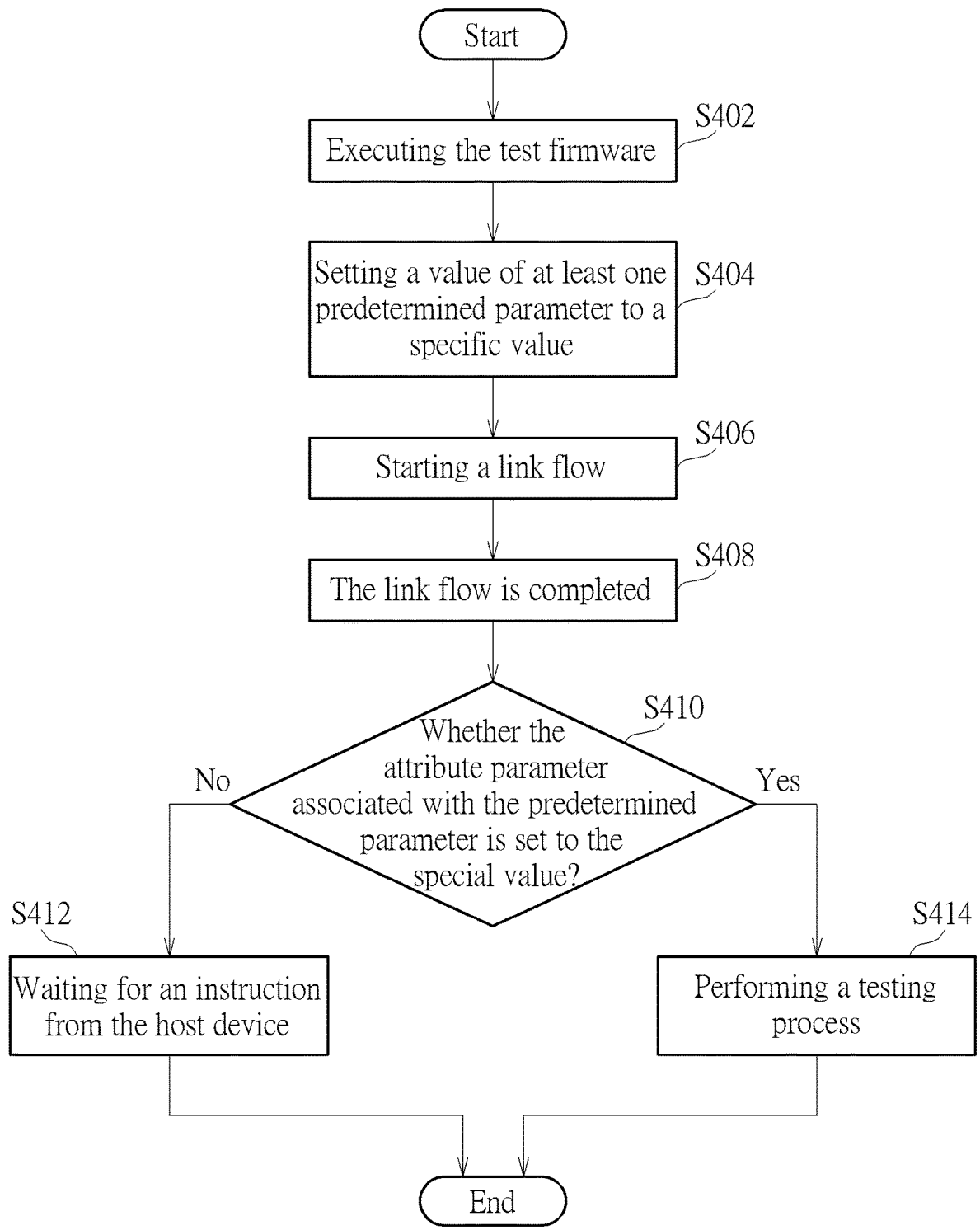
FIG. 4 is an exemplary flow chart of a test method in which the proposed link identification method is applied according to an embodiment of the invention.

FIG. 4 is an exemplary flow chart of a test method in which the proposed link identification method is applied according to an embodiment of the invention. The test method comprises the following steps:

Step S402: Executing the test firmware when the device under test (for example, the data storage device 100/200) powers on.

Step S404: Setting a value of at least one predetermined parameter to a specific value.

Step S406: Starting a link flow to try to establish a transmission link with another peer (for example, the memory controller 110 itself or a host device) by using the host interface.

Step S408: The link flow is completed.

Step S410: Determining whether the attribute parameter associated with the predetermined parameter used in step S404 among the plurality of attribute parameters associated with the transmission link is set to the special value, so as to identify an object device with which the host interface establishes a transmission link. If 'no' is determined, it means that the object device is a host device and the device under test performs step S412. If 'yes' is determined, it means that the object device is not a host device and the device under test performs step S414.

Step S412: Waiting for an instruction from the object device (i.e. the host device).

Step S414: Performing a testing process. As described above, when determining that the device under test is not connected to a host device, it is determined that the device under test is now in the second test phase/test station, and device under test (that is, the test device) should ignore any commands (if any) from the host device and directly perform the testing process defined in the second test phase, such as the aforementioned loopback test and self-test.

In the conventional design, in order to allow the test device to simply perform the self-test in the second test phase, the loopback test is arranged in the first test phase and the loopback layout is configured in the first test station.

Under this arrangement, the device under test cannot successfully establish a transmission link in the second test phase, so that it is possible to determine which test phase/test station the test device is currently in based on whether the transmission link has been successfully established.

However, the loopback layout configured in the first test station may additionally cause some connection errors. In order to avoid the generation of connection errors, the loopback layout is now changed to be configured in the second test station, and the loopback test is arranged in the second test phase as well. However, as described above, since the device under test may successfully establish a transmission link in the link flow of the both the first test phase and the second test phase, it becomes insufficient to identify which device the device under test is currently establishing a transmission link with only based on whether the transmission link has been successfully established or not. If the device under test is unable to make correct identification in the testing process, there will a problem that the testing process cannot be completed due to a link identification error. For example, in the flow chart shown in FIG. 4, if step S404 is omitted, and it is to determine whether the transmission link has been successfully established in only step S410, then no matter which test phase the test device is currently in, only step S412 will be performed eventually.

Different from the conventional design, in the proposed link identification method, the microprocessor 112 can simply and correctly identify which test phase the test device is currently in through the setting of the specific value to the predetermined parameter, which effectively solves the problem in the conventional design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory controller, coupled to a memory device and configured to control access operations of the memory device, comprising:
   a host interface; and
   a microprocessor, coupled to the host interface and configured to set a value of a predetermined parameter to a specific value after the memory controller powers up and start to perform a link flow to try to establish a transmission link via the host interface,
   wherein the predetermined parameter is one of a plurality of capability parameters of the host interface and the predetermined parameter is related to reception of the host interface, and
   after the link flow is completed, the microprocessor is further configured to identify an object device with which the host interface establishes the transmission link according to the specific value and at least one of a plurality of attribute parameters associated with the transmission link.

2. The memory controller of claim 1, wherein in the link flow, the microprocessor is further configured to obtain a plurality of capability parameters of the object device and set corresponding values of the attribute parameters associated with the transmission link according to the capability parameters of the host interface and/or the object device.

3. The memory controller of claim 2, wherein after the link flow is completed, the microprocessor is configured to determine whether the object device is the memory controller itself by determining whether said at least one of the plurality of attribute parameters associated with the transmission link is set to the specific value.

4. The memory controller of claim 1, wherein when the microprocessor identifies the object device, the microprocessor is further configured to determine a subsequent operation based on an identification result of the object device.

5. The memory controller of claim 4, wherein when the microprocessor determines that the object device with which the host interface establishes the transmission link is the memory controller itself based on the identification result, the microprocessor is configured to start a testing process.

6. The memory controller of claim 4, wherein when the microprocessor determines that the object device with which the host interface establishes the transmission link is not the memory controller itself based on the identification result, the microprocessor is configured to wait for an instruction from the object device.

7. A test device comprising the memory controller in claim 1, wherein the memory controller is installed in the test device, and the test device further comprises:
   a transmission pin, coupled to a transmission terminal of the host interface;
   a reception pin, coupled to a reception terminal of the host interface; and
   a trace, connecting the transmission pin and the reception pin.

8. A link identification method for a memory controller, wherein the memory controller is coupled to a memory device and configured to control access operations of the memory device, the link identification method comprises:
   setting a value of a predetermined parameter of the memory controller to a specific value after the memory controller powers up, wherein the predetermined parameter is one of a plurality of capability parameters of the memory controller and the predetermined parameter is related to reception of a host interface of the memory controller;
   performing a link flow to try to establish a transmission link via the host interface; and
   identifying an object device with which the host interface establishes the transmission link according to the specific value and at least one of a plurality of attribute parameters associated with the transmission link after the link flow is completed.

9. The link identification method of claim 8, wherein step of performing the link flow to try to establish a transmission link via the host interface further comprises:
   obtaining a plurality of capability parameters of the object device; and
   setting corresponding values of the attribute parameters associated with the transmission link according to the capability parameters of the host interface and/or the object device.

10. The link identification method of claim 9, wherein step of identifying the object device with which the host interface establishes the transmission link according to the specific value and said at least one of the plurality of attribute parameters associated with the transmission link after the link flow is completed further comprises:
    determining whether said at least one of the plurality of attribute parameters associated with the transmission link is set to the specific value;
    determining that the object device is the memory controller itself when said at least one of the plurality of attribute parameters associated with the transmission link is set to the specific value; and determining that the object device is not the memory controller itself when said at least one of the plurality of attribute parameters associated with the transmission link is not set to the specific value.

11. The link identification method of claim 8, wherein when the object device is identified, the link identification method further comprises:

determining a subsequent operation based on an identification result of the object device.

12. The link identification method of claim 11, wherein when the identification result indicates that the object device is the memory controller itself, the link identification method further comprises:

starting a testing process.

13. The link identification method of claim 11, wherein when the identification result indicates that the object device is not the memory controller itself, the link identification method further comprises:

waiting for an instruction from the object device.

\* \* \* \* \*